(12) United States Patent
Zens et al.

(10) Patent No.: US 7,352,185 B1
(45) Date of Patent: Apr. 1, 2008

(54) MULTI-FUNCTIONAL NMR PROBE

(75) Inventors: Albert P. Zens, Salinas, CA (US); James P. Finnigan, Saratoga, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/603,551

(22) Filed: Nov. 22, 2006

(51) Int. Cl.
*G01V 3/00* (2006.01)

(52) U.S. Cl. ........................... 324/322; 324/318

(58) Field of Classification Search ............... 324/322, 324/318, 314, 300
See application file for complete search history.

(56) References Cited

U.S. PATENT DOCUMENTS

| | | | | |
|---|---|---|---|---|
| 5,162,739 A | * | 11/1992 | Doty | 324/322 |
| 5,424,645 A | * | 6/1995 | Doty | 324/318 |
| 5,861,748 A | * | 1/1999 | Schaefer et al. | 324/318 |
| 5,982,179 A | | 11/1999 | Munsell et al. | |

OTHER PUBLICATIONS

Article by Schnall, et al., entitled A New Double-Turned Probe for Concurrent 1H and 31P NMR,published in the Journal of Magnetic Resonance, 65, 000-000, (1985).

Article by Haase, et al., entitled "Double Resonance Probes for Close Frequencies", published in the Journal of Magnetic Resonance, 135, 273-279 (1998).

Article by Hu, et al., entitled "Single-Input Double-Tuned Circuit for Double Resonance Nuclear Magnetic Resonance Experiments", published in the Review of Scientific Instruments, vol. 69, No. 2, Feb. 1998, pp. 477-478.

Publication "Z-Spec Operational Manual" published by Nalorac Cryogenics Corporation, pp. 1-8.

Publication No. 01-000121-00 Rev. J00505 entitled "AutoSwitchable, 4 Nucleus, and ATB NMR Probes" published by Varian, Inc. NMR Systems, pp. 1-29.

* cited by examiner

*Primary Examiner*—Louis M. Arana
(74) *Attorney, Agent, or Firm*—Edward H. Berkowitz; Bella Fishman

(57) ABSTRACT

A single RF port, multiply-resonant circuit comprises coupled resonant sub-circuits coupled through an adjustable reactive element exhibiting a dynamic range that includes a value of the reactive component of sufficient magnitude to produce an impedance producing substantial mutual isolation of the sub-circuits.

6 Claims, 6 Drawing Sheets

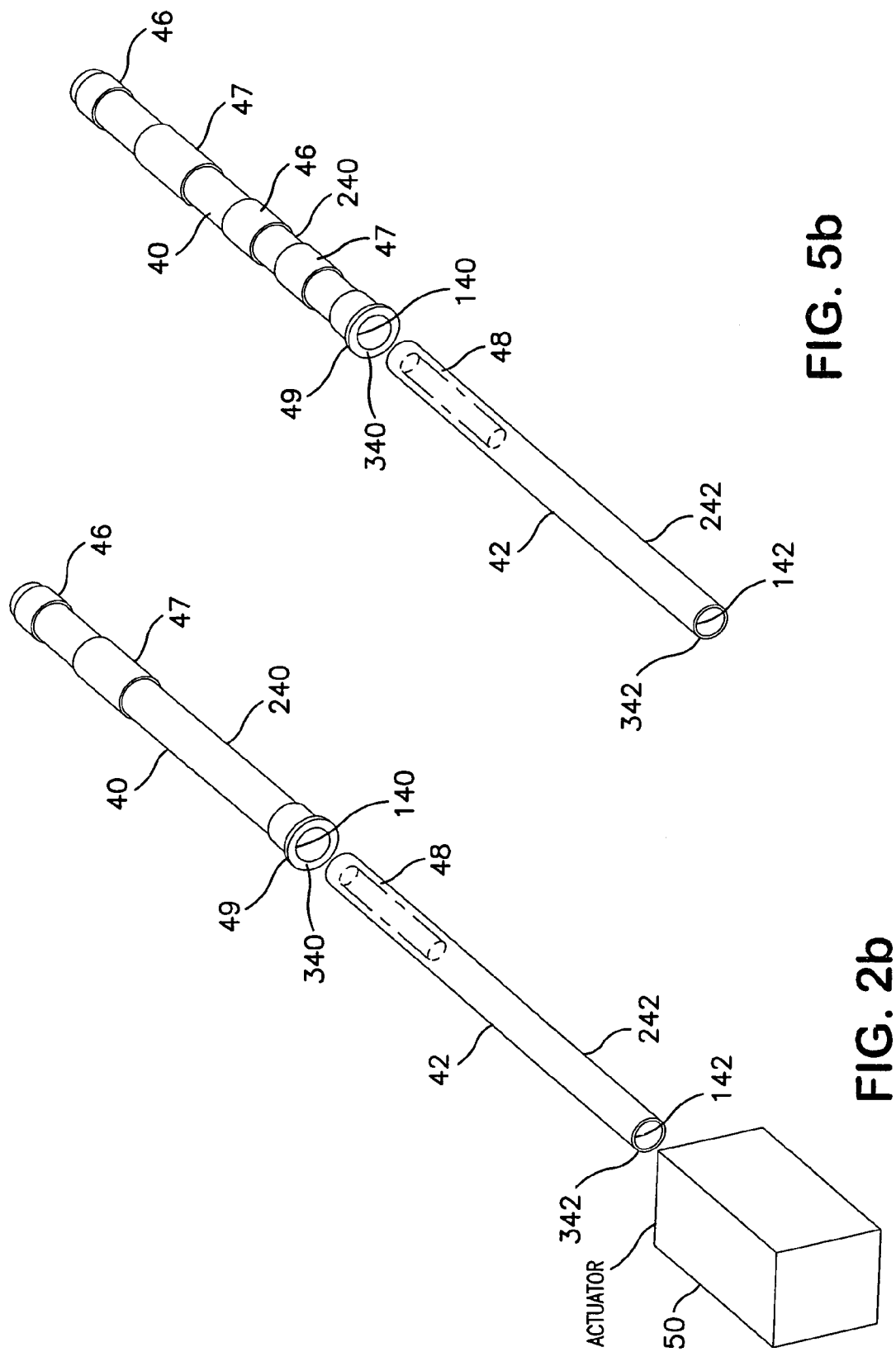

MULTI-FUNCTIONAL NMR PROBE

RELATED APPLICATION

This application is related to the application entitled "Minimal Capacitance Adjustable Capacitor" by James P. Finnigan, which application is being filed on the same date as the present application and is assigned to the assignee of the present application.

BACKGROUND OF THE INVENTION

Multi-resonant probe circuits for nuclear magnetic resonance (NMR) usage have been employed for decades in a wide variety of double resonance experiments. The present work is particularly directed to a class of multi-resonant probe especially distinguished by selectable use for concurrent or solo resonant capability.

Concurrently resonant probe circuits are discussed by Chance, et al J. Mag. Res., v. 65, pp. 122-129 (1985); by Slichter et al, J. Mag. Res., v. 135, pp. 273-279 (1998); and by Hu et al, Rev. Sci. Instr., v. 69, pp. 477-478 (1974) and this class of device embodies a circuit having a single port for accommodation of RF signals. The circuit exhibits distinct, well separated resonant response to RF currents of corresponding frequencies. For clarity, the greater part of the present work is described in terms of an NMR probe circuit responsive to two resonances.

Concurrently resonant NMR probes were available from both Varian Associates, Inc. and Nalorac Corp., circa 1994. Such prior art probes were often referenced as "4 nucleus probes" because two coaxial RF coils of such probes were each supported by a concurrently resonant circuit of the above type and a pair of resonant nuclei could be simultaneously manipulated/observed from one of these coils and its supporting circuit.

In both of the above prior art examples, concurrent sensitivity was achieved in a single RF port communicating with a first of a pair of coupled sub-circuits. The first ("principal") sub-circuit includes the RF port and the NMR coil that couples to the sample, and is capable of tuning to resonant response to either of the specified resonances. The second ("auxiliary") sub-circuit is responsive to at least one of the specified resonant frequencies. The auxiliary sub-circuit, or resonator, is electrically coupled to the primary sub-circuit, but has no coupling to the sample. Solo sensitivity was achieved in prior art by re-adjustment of the coupling between the auxiliary resonance sub-circuit until the first sub-circuit responds only to the desired (solo) resonance. The Varian circuit featured a conventional tank circuit tuned for $^{31}$P and capacitively coupled to a quarter wave stub as a second resonator to provide for $^{13}$C sensitivity. The quarter wave stub was physically removed from the circuit to obtain solo $^{31}$P-$^{15}$N sensitivity. The Nalorac example was realized in a similar single RF port, two sub-circuit architecture and solo mode operation for the nuclei of gyromagnetic ratio (gamma) lower than $^{31}$p was obtained by removing the resonant structure of the auxiliary sub-circuit and re-tuning the other sub-circuit to the desired resonance. In both of these prior art examples, the coupling link between the sub-circuits was undisturbed for modal transitions in operations involving low gamma nuclei and the resonant sub-circuits were modified to attain the desired function.

Another prior art example includes an arrangement of a tuned LC circuit coupled to a ¼ wave stub wherein the ¼ wave coaxial element is constructed to for an alternative role of support for additional capacitors inserted into the LC circuit for single tuned operation, or as a switch through manipulation of the center conductor component. See U.S. Pat. No. 5,982,179, commonly assigned. In solo mode operation, the structure of the circuit/sub-circuits was drastically re-arranged.

For operations involving high gamma nuclei ($^{1}$H, $^{19}$F, $^{3}$H) with modern NMR magnets, the prior art circuit considerations limit the coupling capacitance to (approximately) several tenths of picofarads compared to tens of picofarads for the low gamma nuclear resonances. Switching into solo mode operation for high gamma nuclei was not a feature of the prior art because the coupling link severely impacted the performance of the circuit.

Nuclei such as $^{1}$H and $^{19}$F are characterized by a high value of gyro-magnetic ratio ("gamma") compared to $^{31}$p and $^{13}$C (and others) with the result that, in a given magnetic field, the high gamma nuclei resonate at much higher frequencies and present significantly different problems of RF circuit design. The concurrent $^{31}$P and $^{13}$C function was supplemented by the ability to operate alternatively in a singly resonant, or solo, mode for either of these nuclei by alteration of the resonant circuit. However, that feature was unavailable for the high frequency channel, e.g., the high gamma nuclei.

In simple summary, series coupled resonant circuits deriving RF power from a single port driving the first of these circuits demands at least four adjustments: (a and b) tuning the frequency of each resonant circuit; (c) impedance matching the port to the RF power source; and (d) adjusting the coupling. It is possible to accommodate the auxiliary sub-circuit to fixed specifications. However, the ability to retain the observable sensitivity of the first sub-circuit is lacking in the prior art because the coupling was undisturbed and the auxiliary resonator was not sufficiently isolated from the first sub-circuit As above noted, the prior art transition between concurrent and solo mode function for low gamma nuclei necessitated altering the auxiliary sub-circuit as well as tuning of the first sub-circuit. It is most desired to retain sensitivity, to enhance the signal-to-noise performance, to minimally disturb the sub-circuit structure or frequency response and the like in transitions between concurrent and solo mode of operation for NMR experiments generally.

SUMMARY OF THE INVENTION

A pair of series-coupled, resonant sub-circuits include a first sub-circuit, includes a single RF port, capable of tuning in a frequency range to any one of (at least) a pair of discrete resonant frequencies. In operation, the first sub-circuit is tuned for one such selected (usually higher) frequency, and a second sub-circuit, having RF properties generally similar to the first sub-circuit, capable of response to another (usually lower) frequency. In an asymmetrical arrangement, and operating in concurrent mode, a single RF port is provided for the first sub circuit, which, in turn, is coupled through a reactive element (sufficient to constitute a functional RF switch) to the second resonant (auxiliary) sub-circuit. The reactive RF switch, in one extreme state, has the property of an RF impedance "approaching infinity" (as discussed below) providing isolation of the auxiliary sub-circuit from the first sub-circuit for solo mode observation of the (for example) higher frequency resonance in the first sub-circuit without any alteration of the auxiliary sub-circuit. The functionality of concurrent response may be subordinated to a paramount need for improved performance, as for example, a more rapid completion of the measurement. The RF power supplied to a concurrently resonant circuit is divided between the sub-circuits, which typically exhibit similar values for L and Q. From the substantially equal division of power and the principle of reciprocity, the solo mode provides an improvement in the nature of a factor of 2 for signal averaging time.

In NMR practice, the multi-functional versatility of this arrangement for proton and fluorine resonances is especially useful for simple $^1$H or for $^{19}$F resonances, or for indirect detection experiments directed toward $^{13}$C bonds in either hydrocarbon or fluorocarbon molecules, or in fluoro-hydrocarbon molecules. Using appropriate pulse sequences, either C—F bonds or H—F bonds are investigated with the same probe with unusual ease and economy. A selectable third resonant sub-circuit can easily be accommodated through expansion of the reactive switch from an (effective) two state selectable structure to an (effective) three state selectable structure (reserving a floating switch state for mutual isolation).

The multi-functionality is better expressed in terms of practical NMR classes of experiments where we will take the resonant sub-circuits to correspond to $^1$H and $^{19}$F resonance and the molecule of interest to contain bonds directed to nucleus X which can be assumed to be $^{13}$C by way of example. The classes of operation available with the same probe apparatus may be catalogued:

| Decouple | Observe |
|---|---|
| | Concurrent mode |
| $^1$H | $^{19}$F |
| $^{19}$F | $^1$H |
| $^{19}$F | $^{13}$C (indirect, through $^1$H spectra) |
| $^1$H | $^{13}$C (indirect, through $^{19}$F) |
| $^{19}$F | $^{13}$C direct |
| $^1$H | $^{13}$C direct |
| $^1$H and $^{19}$F | $^{13}$C direct |
| | Solo Mode |
| $^{19}$F | $^{13}$C direct |
| $^1$H | $^{13}$C direct |

These several operational configurations are obtained with minimal disturbance of the set of adjustable parameters of the sub-circuits of the probe. The above list illustrates the versatility and economy realized through a probe of the present form.

Indirect detection experiments utilize pulse sequences (which need not be enumerated here) to so excite and manipulate the nuclear spins of the bonded species, that, for example, $^{13}$C spectral features may be observed through the much stronger $^1$H (or $^{19}$F) signal following appropriate manipulation of the relevant nuclear spins. The functionality of concurrent/solo resonant modes furnishes a useful tool for these investigations. For example, the study of fluorinated-hydrocarbon molecules presents a case where both C—F and C—H bonds occur in the same molecule and either or both classes of bonds are accessible for study with the same probe.

BRIEF DESCRIPTION OF THE DRAWINGS

FIG. 2b shows a preferred embodiment for the component C6 of FIG. 2a.

FIG. 5b is an extension to the RFX of FIG. 2d.

DETAILED DESCRIPTION OF THE INVENTION

Figure 1:
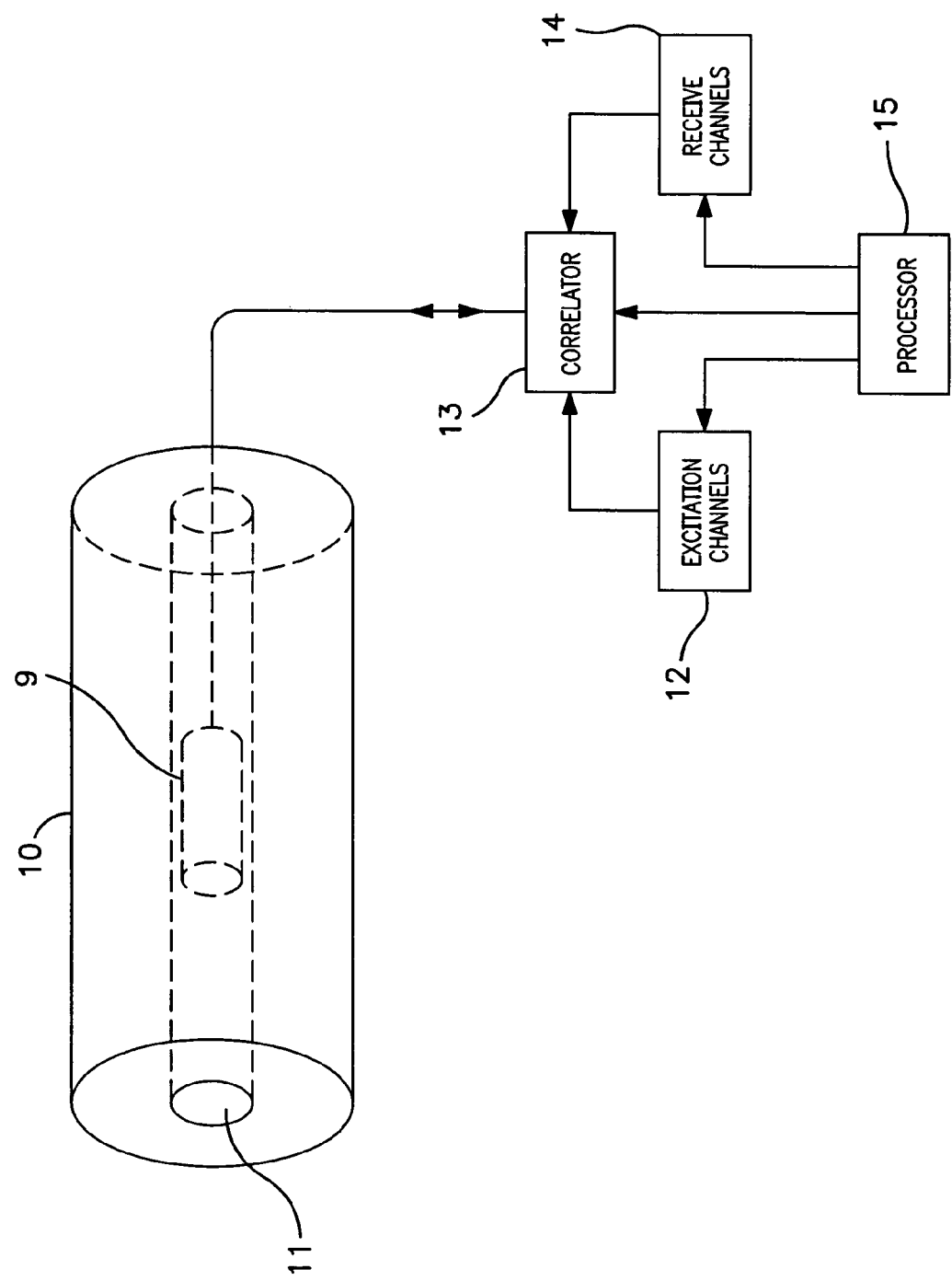
FIG. 1 provides the context for the present work.

FIG. 1 serves to illustrate conceptually the context of this work within an NMR system. An NMR probe 9 is disposed within the bore 11 of a superconducting magnet 10. A sample for analysis is presented in a sample vessel (not shown) inserted in the probe 9. The probe 9 inductively couples to the nuclear spins of the sample for excitation/acquisition through at least a first RF excitation channel(s) 12 and separately for signal acquisition through receiver channel(s) 14. Excitation and receive functions often share a common probe coil for non-concurrent operation through correlator 13, but multiple coils are frequently employed to serve different functions, such as to furnish spin decoupling, field-frequency lock, and the like. In the present work, either or the several multiple coils may utilize the benefit of the multiple modalities of operation disclosed herein. Probes are frequently configured for sensitivity to more than one resonance, as is the case in the present work. The receive channel ordinarily includes a preamplifier and RF demodulator, phase detector, analog-to-digital conversion (ADC) and various signal processing apparatus together with a digital processor 15 to effect averaging, Fourier transformation, storage and the like. In like manner, processor 15 controls both the excitation channel 12 and receive channel 14. More recently, some of these functions are consolidated in a direct digital receiver, but these variations are not critical to the understanding or operation of the present multi-functional probe. An input/output module provides for instruction of the processor 15, provision for display of data and general operator intervention.

Figure 2A:
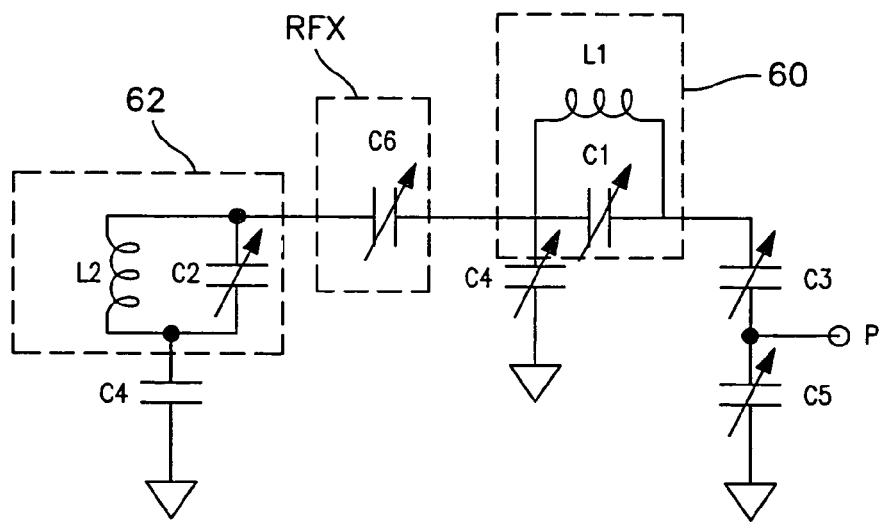
FIG. 2a is an illustrative preferred embodiment with both sub-circuits asymmetrically coupled.

Turning now to FIG. 2a, there is shown an unbalanced NMR probe circuit comprising a first LC resonant sub-circuit 60 tuned by capacitance C1 and inductive component (coil) L1. (Multiple coils are common in NMR probes and it is unnecessary to associate the present probe circuit with a particular identifiable coil.) First sub-circuit 60 is specified to support through appropriate tuning of C1, at least either of two resonances $\omega_1$ or $\omega_2$. These resonances are sufficiently closely spaced for this purpose and one of skill in the art immediately recognizes that $^1$H and $^{19}$F are easily accommodated and present particular utility in NMR measurements. (Other pairs of NMR resonances present similar opportunity.) The second resonant LC sub-circuit 62 (which may comprise lumped elements, or ¼ wave transmission line) has similar, not necessarily identical RF properties to the first sub-circuit to form a split resonance in combination with the first sub-circuit. Tuning and matching to single RF port P is achieved through the capacitive divider C3-C5 sub-circuits 60 and 62 are coupled through an effective RF switch designated RFX. Any reactive component(s) may form the basis for an RF switch having the properties of an extremely high impedance, approaching infinity, in one state and a selected low impedance in an alternative state.

FIG. 2b is one realization for the RF switch C6, discussed in more detail below, where the structure of C6 presents a minimum capacitance value "approaching zero". Capacitance values of the order of 0.01 pf, and less, characterize this embodiment of RFX. In this embodiment, C6 is essentially a 2 state capacitor in its usage here (ignoring intermediate values of capacitance). To one of skill in the art, this condition for (capacity) C→0 is quantifiable for the case of FIG. 2a in relative terms with the prescription that for C6 the minimum capacitance value is very small compared to other relevant capacitances of the circuit in which this RF switch is deployed and inclusive of the relevant parasitic capacitances. The qualification of "relevant" capacitances is meant to recognize that arbitrary parts of the circuit, while at some physical remove from one another, may be said to define a vanishingly small capacitance therebetween, even while having no particular functional relationship and therefore are not relevant to this quantification. It is intended that, by this contrast in the value of the minimum capacitance to other relevant capacitances of the circuit, the concept can be recognized of a capacitance value approaching zero to yield a capacitive reactance component of impedance approaching infinity. As a consequence, the RF impedance will be understood to be of such magnitude to provide the desired achievable isolation of the sub-circuits. By way of example, the capacitance relative to ground of the individual stators of the capacitive RF embodiment of FIG. 2a, or the observe coil structure (relative to an adjacent decoupling coil structure) is "relevant" because interaction of these circuit elements affect the functionality of the circuit. This preferred RFX component, suitable for general application and for particular application to coupling/decoupling resonant sub-circuits, is implemented with particular attention to use in NMR probe circuits both for the functional role as an RF switch and through the choice of materials.

FIG. 2b, illustrating an example of a preferred embodiment of the element C6, is implemented with coaxial silica glass tubes 40, 42 (a preferred class of material for the NMR context) selected to exhibit mutual dimensional tolerance to support at least a slip fit therebetween. For ease of description only, consider the outer tube 40 (of thickness 340) to support a pair of conductive bands 46, 47 on the outer surface 240 of the outer tube 40, each band having a selected azimuthal extent and axially spaced apart by an amount such that the intrinsic capacitance between these conductive bands is infinitesimal. These conductive bands 46, 47 each comprise stators forming a capacitor unit comprising a pair of series connected capacitances in conjunction with a floating conductor 48 supported by the inner tube 42. One of these capacitances is fixed and one variable with relative motion of floating conductor 48. For stators supported on the outer surface 240 of the outer tube 40, either inner surface 142 or outer surface 242 of the inner tube 42 (of thickness 342) may be selected to support the floating conductor 48 which may be conveniently regarded as a moveable capacitor plate. The axial extent of the floating conductor 48 is sufficient to completely overlap the two stator plates in one position (maximum capacitance) of the device. Relative displacement of the (assumed moveable) floating conductor 48 in response to an actuator 50, progressively decreases the capacitance of one of the series capacitances and continued relative displacement ultimately breaks the series connection of the two capacitors. Further relative displacement may be desirable to reduce parasitic capacitance. Such a capacitor structure has been found to realize a particularly small minimum capacitance providing the desired isolation between sub circuits 60 and 62. The minimal capacitance is achieved without additional solder joints and losses associated with serial stacking of chip capacitors. Concurrently filed application entitled "Minimal Capacitance Adjustable Capacitor" by James P. Finnigan, describes in greater detail such an adjustable capacitor particularly suitable for this application.

Figure 2C:
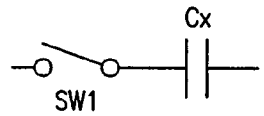
FIG. 2c is an alternative realization of an RF switch.

FIG. 2c offers an alternative functional arrangement for RFX incorporating a simple switch SW1 to isolate the sub-circuits 60 and 62 and a capacitance Cx to furnish the appropriate coupling impedance in concurrent mode of operation. In operation of the RFX embodiment of FIG. 2b, one observes that progressive relative displacement of the floating conductor 48 away from a fully opposite-projection of the two conducting bands 46, 47 leads eventually to a break in the circuit as here illustrated with the indicated conventional switch SW1 of FIG. 2c.

Figure 2D:
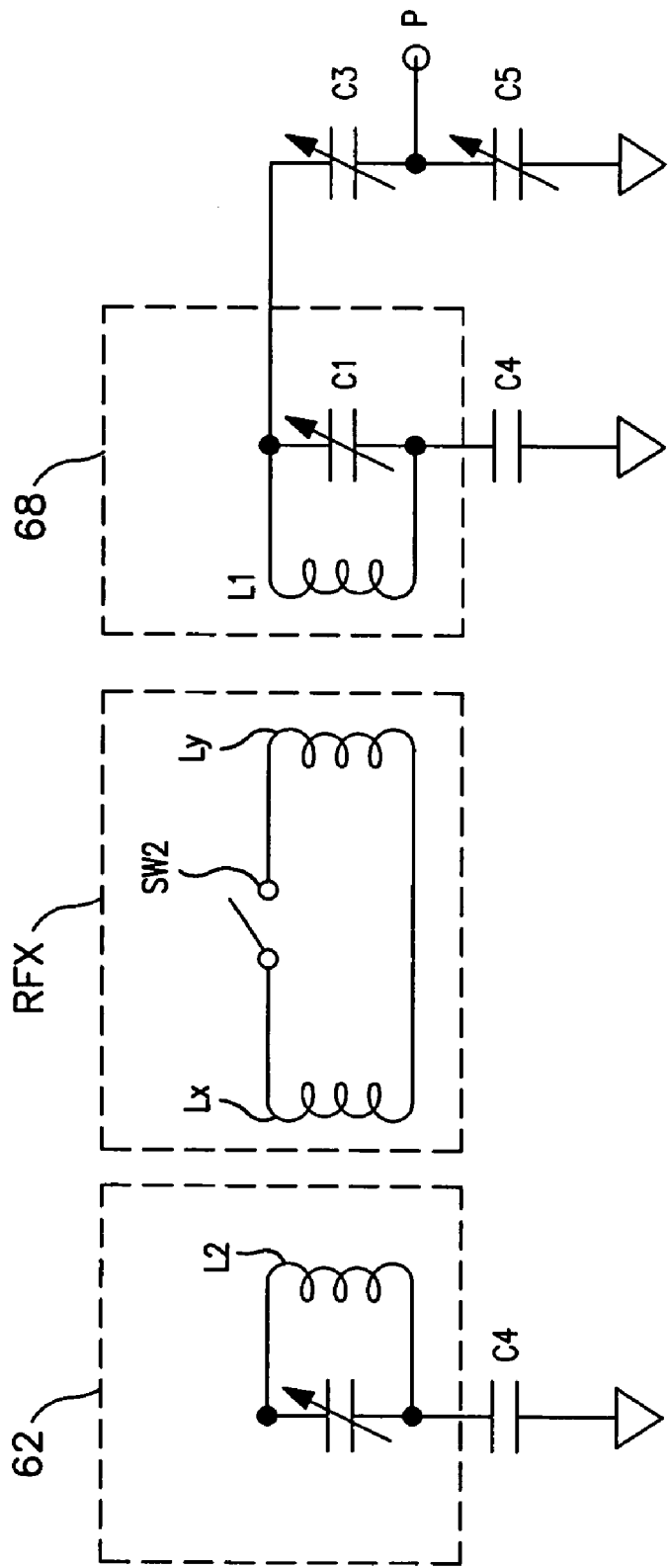
FIG. 2d is the same as FIG. 2a with an inductive form of RF switch.

FIG. 2d is identical to FIG. 2a with the exception that RFX comprises an inductive reactance coupling the two sub-circuits with isolation achieved through opening of SW2.

Figure 3:
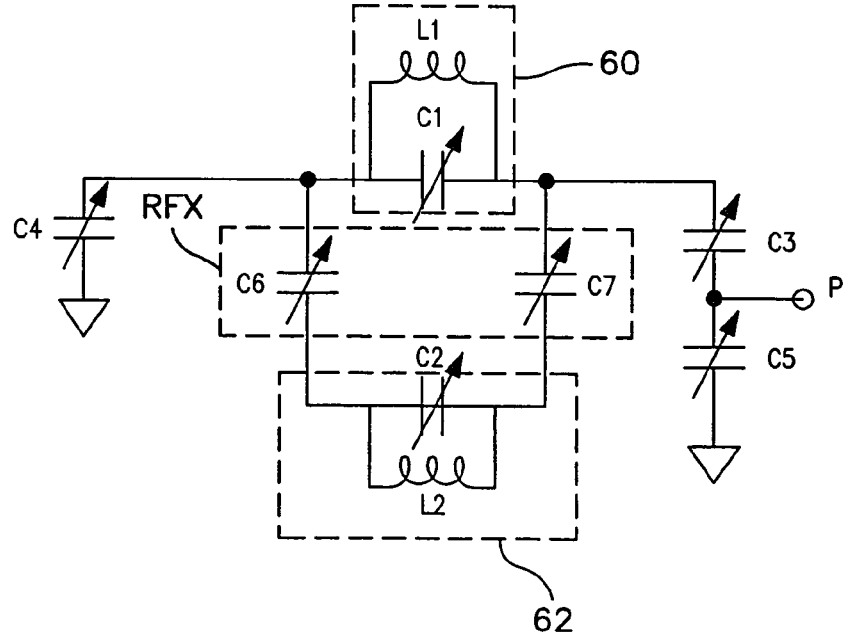
FIG. 3 is a symmetrical embodiment of the present work.

FIG. 3 is a balanced version of the embodiment of FIG. 2a. The sub-circuits 60 and 62 correspond to the like denominated items of FIG. 2a with two reactive switches shown here as C6 and C7. A ganging constraint is easily implemented between separate adjustable capacitors or such constraint may be inherent in an implementation wherein two adjustable capacitors of the FIG. 2b embodiment are realized separately on the same tubular supports 40, 42.

Figure 4A:
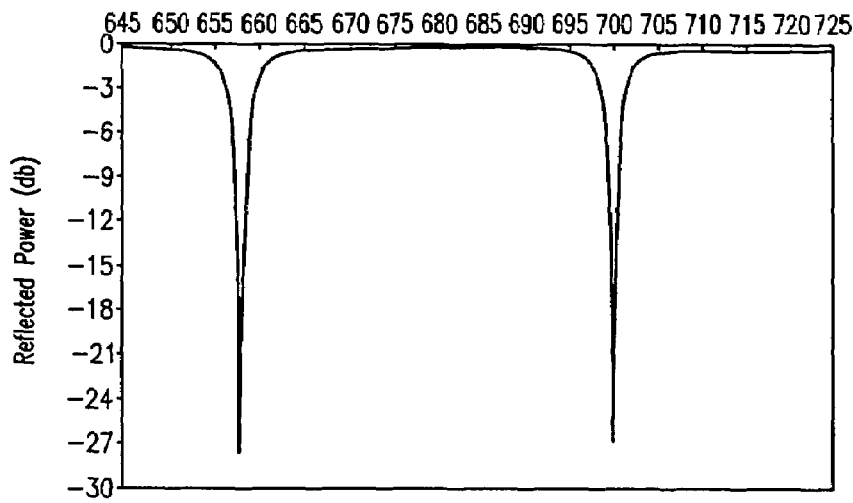
FIG. 4a shows concurrent resonances of the circuit of FIG. 2a for $^1$H and $^{19}$F through reflection factor measurements at the RF port.
Figure 4B:
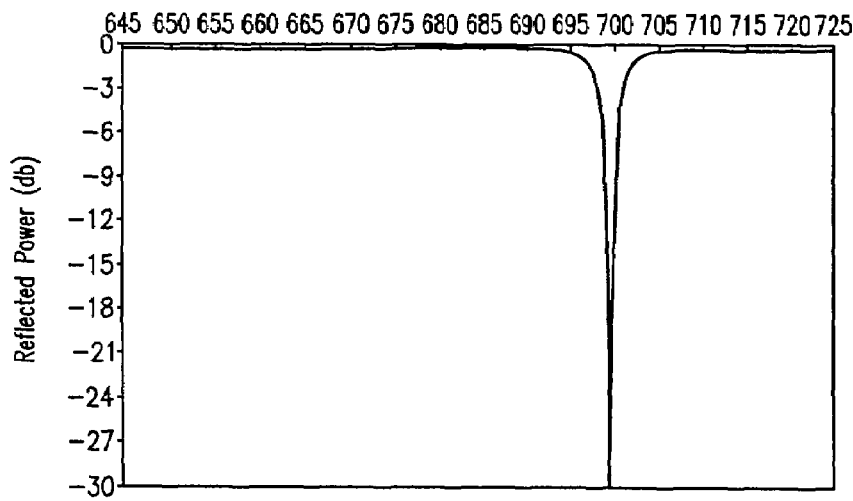
FIG. 4b shows solo-mode resonance for $^1$H.
Figure 4C:
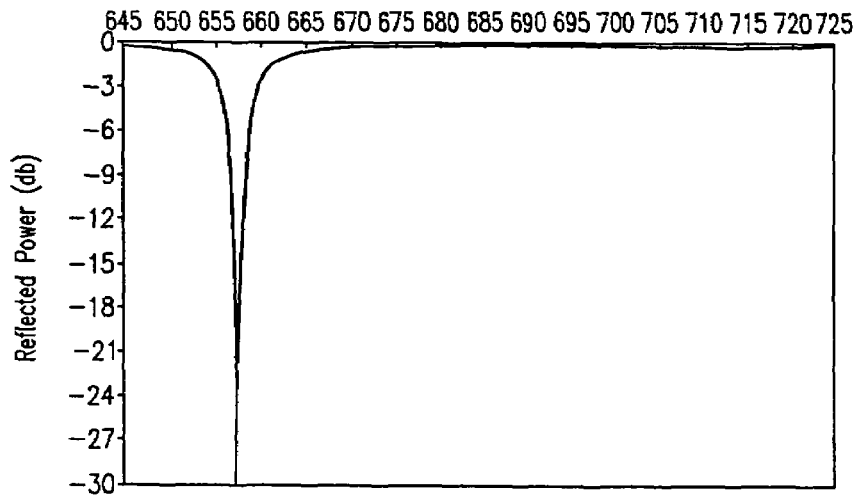
FIG. 4c shows solo mode resonance for $^{19}$F.

A probe in accord with FIG. 2a for concurrent/solo mode experiments with $^1$H and $^{19}$F was constructed and tested. The RF performance of this circuit has first been bench tested with the aid of a network analyzer operating in the range from 645 to 725 MHz to acquire reflected power characteristics and the results are shown in FIGS. 4a-4c. A further test ("B1 field displacement") measures the frequency shift as a fraction frequency upon perturbation of the energy storage properties of the inductance of the circuit to provide relative performance of the circuit under different operating conditions. The quantitative results are tabulated for discussion below. In FIG. 4a the coupled sub-circuits are concurrently sensitive to an RF input applied at port P where the coupling capacitor C6 is in a high (or highest) capacitance state (maximally coupled). The absorbance feature to the high frequency side of the spectrum corresponds to a proton resonance at 700 MHz and the feature to the right corresponds to a fluorine resonance (658.7 MHz). At FIG. 4b, the capacitor C6 of FIG. 1 has been returned to its minimal capacitance state for maximum isolation of the sub-circuits 60 and 62. The split of the network frequency response into two resonances is now removed completely and only one resonance, corresponding to the higher frequency resonance ($^1$H) remains after re-tuning. The second sub-circuit remains unaltered: only the coupling component has been altered. At FIG. 4c, the lower frequency resonance (corresponding to $^{19}$F) remains after capacitor C6 has been placed in its highest impedance position and the first sub-circuit 60 is re-tuned to return the circuit response to the desired frequency. From these reflected power data, a nominal Q is extracted from signal-to-noise performance and in combination with the discrete field displacement measurement of B1 frequency shift one obtains of the product of these measured parameters which is proportional to a quantity of energy stored in the circuit. In the ultimate application to NMR (and comparison with NMR performance), it is convenient to obtain relative values of this parameter and invert it to indicate the input power required to generate identical field conditions in the NMR coil. Table 1 exhibits the bench test data for several operational modes together with the corresponding observations for an optimized probe suitable for normalization purposes.

An NMR probe "HX" has been employed to furnish a normalization baseline for the bench test comparison. With an equivalent NMR coil configuration this probe is appropriate for the performance comparisons with prior art. We define solo mode for the present ("H/F{X}") probe to be the operating mode with full isolation furnished by the reactive switch RFX, and this mode is compared to the HX probe (having no auxiliary sub-circuit to isolate. The observed 72.5% relative efficiency for the present H/F{X} probe in solo mode compares with the 69.0% observed for the HX probe.

TABLE 1

(Bench Test)

| Probe | Mode | Nucleus | f [MHz] | Q | field displacement test [%] | $E_{rBench}$† [%] |
|---|---|---|---|---|---|---|
| present "H/F{X}" | dual | $^1H$ | 700.0 | 273 | 0.614% | 100% |
|  |  | $^{19}F$ | 658.7 | 213 | 0.182% | 100% |
|  | solo | $^1H$ | 700.0 | 261 | 0.886% | 72.5% |
|  |  | $^{19}F$ | 658.7 | 156 | 0.471% | 52.9% |
| H{X}* | n/a | $^1H$ | 700.0 | 270 | 0.900% | 69.0% |

*Optimized probe for normaliztion
†$E_{rNMR}$ represents power required to achieve constant field inside NMR coil.

Relative performance of the circuit in solo mode compared to dual mode shows significant improvements, comparable to the HX probe (which is limited to only solo mode functionality. The concurrent mode of operation ("dual mode") for the present probe should be regarded as representative of the concurrent performance achieved in prior art of that type.

Table 2 contains a summary of test data obtained at 700 MHz in the context of actual NMR performance.

TABLE 2

(NMR tests)

| Probe | Mode | Nucleus | f [MHz] | $pw_{90}$ @ 1 W [µs] | Power needed for 1mT $B_1$ field [W] | $E_{rNMR}$* [%] |
|---|---|---|---|---|---|---|
| present H/F{X} | dual | $^1H$ | 700.0 | 37.5 | 40.6 | 100% |
|  |  | $^{19}F$ | 658.7 | 61.4 | 96.6 | 100% |
|  | solo | $^1H$ | 700.0 | 30.5 | 26.9 | 66.2% |
|  |  | $^{19}F$ | 658.7 | n/a | n/a | n/a |
| H{X} | n/a | $^1H$ | 700.0 | 30.6 | 27.0 | 66.4% |

*$E_{rNMR}$ represents power required to achieve constant field inside NMR coil.

In each of these sets of measurements the solo mode of the present probe is compared with the HX probe (necessarily comparing performance for $^1H$). The power required for one millitesla of magnetic field of the resonant inductance is tabulated together with the power required to obtain this field strength within the coil and this parameter is conveniently and accurately regarded as a the corresponding measurement for the reference H{X} probe in both bench tests and actual NMR usage, where it is again emphasized that these data are referenced to a separate, albeit optimized probe. The extremely close comparison is consistent with the high degree of isolation achieved with the RF switch. These NMR comparisons were necessarily limited to $^1H$. In a separate investigation, the embodiment of FIG. 2a was modeled, using actual component values to yield a computed relative efficiency of better than 90% for comparison with the above values.

Figure 5A:
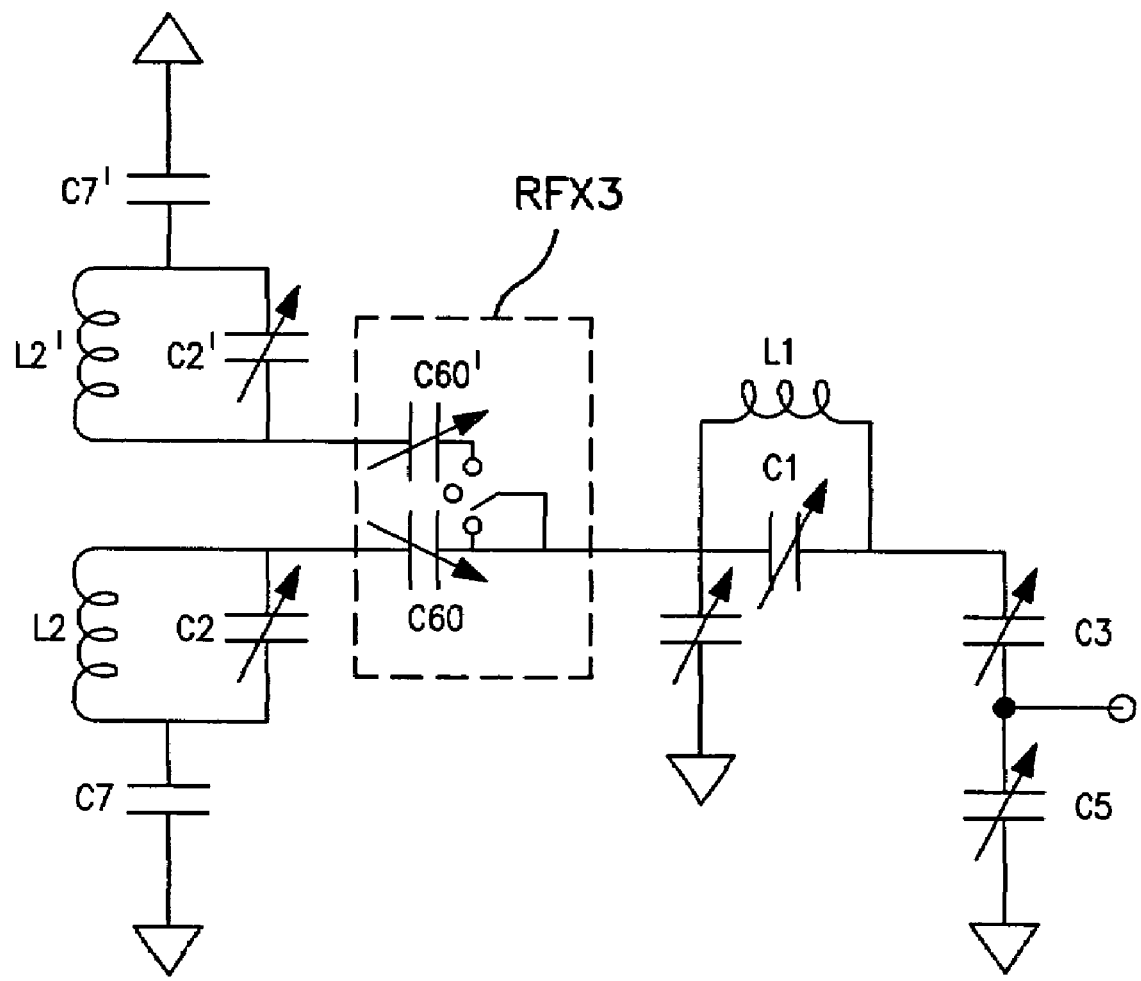
FIG. 5a is an extension of FIG. 2b to accommodate another resonant sub-circuit.

Yet another extension to the embodiment of FIG. 2a is obtained for the arrangement where RFX is expanded from its role as an effective two state (select/isolate) selector switch to a three state selector switch to permit selection of an alternative third sub-circuit. FIG. 5b shows the variation of FIG. 2b including a second pair of stator bands 46', 47' implementing an alternate reactive element for coupling to the resonant circuit L2'-C2'. A sufficient gap between the pairs of stators defines a selectable state for a floating/isolate condition enabling the solo mode.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR probe for investigations of a plurality of nuclear species exhibiting a corresponding plurality of resonant frequencies, said probe comprising:
    a) a first resonant sub-circuit capable of tuning to a selected one of said resonant frequencies and further comprising an RF port r communicating with an external RF apparatus;
    b) a second resonant sub-circuit capable of tuned response to another of said resonant frequencies; and
    c) an RF switch comprising a reactive element coupling said first and second sub-circuits, said RF switch capable of introducing a state of substantial isolation between said sub-circuits, said state of isolation achieved without structural alteration of either said sub-circuits.

2. The NMR probe of claim 1, wherein said reactive element comprises an adjustable valued capacitance capable of at least maximum and minimum capacitance values wherein the relative efficiency of the NMR probe for corresponding said minimum capacitance value is at least 0.90.

3. The NMR probe of claim 1, wherein said reactive element comprises an inductive element to introduce inductive coupling between said sub-circuits and said inductive element further comprising a switch.

4. The NMR probe of claim 1, wherein said reactive element comprises a capacitor of selected value of capacitance in series with a switch.

5. The NMR probe of claim 1, wherein said probe comprises a third resonant sub-circuit responsive to a third resonant frequency and said RF switch is capable of selectively coupling to either said second or third sub-circuit.

6. A balanced NMR probe for investigations of a plurality of nuclear species exhibiting a corresponding plurality of resonant frequencies, said probe comprising:
    a) a first resonant sub-circuit capable of tuning to a selected one of said resonant frequencies and further comprising an RF port for communicating with an external RF apparatus;
    b) a second resonant sub-circuit capable of tuned response to another of said resonant frequencies; and
    c) a pair of RF switches comprising a corresponding pair of reactive elements for balanced coupling of said first and second sub-circuits, said RF switches capable of introducing a state of substantial isolation between said sub-circuits.

* * * * *